US008687830B2

(12) United States Patent
Nakamura et al.

(10) Patent No.: US 8,687,830 B2
(45) Date of Patent: Apr. 1, 2014

(54) TELEVISION APPARATUS AND ELECTRONIC DEVICE

(75) Inventors: Kazuhiro Nakamura, Hachioji (JP); Toshikatsu Nakamura, Akishima (JP); Kohei Wada, Tachikawa (JP); Masataka Tokoro, Tachikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 375 days.

(21) Appl. No.: 13/087,136

(22) Filed: Apr. 14, 2011

(65) Prior Publication Data

US 2011/0311086 A1 Dec. 22, 2011

(30) Foreign Application Priority Data

Jun. 18, 2010 (JP) ................................ 2010-139874

(51) Int. Cl.
*H04R 5/02* (2006.01)
*A47B 91/00* (2006.01)
*H05K 5/00* (2006.01)

(52) U.S. Cl.
USPC ........... 381/304; 381/301; 381/305; 181/148; 181/150; 248/346.03

(58) Field of Classification Search
USPC ................. 381/301, 304, 396, 333, 334, 306; 181/153, 148, 150; 248/346.03
See application file for complete search history.

(56) References Cited

U.S. PATENT DOCUMENTS 7,233,678 B2 6/2007 Erixon et al.
7,385,482 B2 6/2008 Wada
7,400,875 B2 7/2008 Konno
8,014,836 B2 9/2011 Konomi et al.
8,208,669 B2 6/2012 Hamada et al.
2003/0096632 A1 5/2003 Kim et al.
2005/0009580 A1 1/2005 Konno
2005/0233781 A1 10/2005 Erixon et al.
2006/0067557 A1 3/2006 Imamura (Continued)

FOREIGN PATENT DOCUMENTS

JP 08-126087 A 5/1996
JP 10-042383 A 2/1998

(Continued)

OTHER PUBLICATIONS

Notice of Rejection mailed by Japan Patent Office on Sep. 4, 2012 in the corresponding Japanese patent application No. 2012-177140, which as filed on Aug. 9, 2012 as a divisional application of Japanese patent application No. 2012-071713, which was a divisional application of Japanese patent application No. 2010-139874.

(Continued)

*Primary Examiner* — Vivian Chin
*Assistant Examiner* — Ammar Hamid
(74) *Attorney, Agent, or Firm* — Knobbe, Martens Olson & Bear LLP

(57) ABSTRACT

According to one embodiment, a television apparatus includes a housing, a skeletal member, a speaker, a speaker holder, and a sound guiding mechanism. The housing is provided with an emission opening. The skeletal member is housed in the housing and fixed to the housing. The speaker is arranged inside the housing. The speaker holder is attached to the skeletal member with an engagement mechanism while holding the speaker. The sound guiding mechanism includes the speaker holder, and guides sound produced from the speaker to the emission opening.

11 Claims, 13 Drawing Sheets

(56) References Cited

U.S. PATENT DOCUMENTS

| | | | |
|---|---|---|---|
| 2006/0078138 | A1 | 4/2006 | Wada |
| 2007/0123321 | A1 | 5/2007 | Konomi et al. |
| 2009/0080681 | A1 | 3/2009 | Hamada et al. |

FOREIGN PATENT DOCUMENTS

| | | | | |
|---|---|---|---|---|
| JP | 3048394 | U | | 2/1998 |
| JP | 11-266292 | A | | 9/1999 |
| JP | 11266292 | A | * | 9/1999 |
| JP | 11-289508 | A | | 10/1999 |
| JP | 11289508 | A | * | 10/1999 |
| JP | 2001-231088 | A | | 8/2001 |
| JP | 2003-169119 | A | | 6/2003 |
| JP | 2004-247892 | | | 9/2004 |
| JP | 2005-012489 | A | | 1/2005 |
| JP | 2005109949 | A | * | 4/2005 |
| JP | 2005-536912 | A | | 12/2005 |
| JP | 2006-100898 | A | | 4/2006 |
| JP | 2006-108791 | A | | 4/2006 |
| JP | 2006-140568 | A | | 6/2006 |
| JP | 2006-319723 | A | | 11/2006 |
| JP | 2006-325010 | A | | 11/2006 |
| JP | 2007-150393 | A | | 6/2007 |
| JP | 2008-167268 | A | | 7/2008 |
| JP | 2008-177861 | A | | 7/2008 |
| JP | 2008-193486 | A | | 8/2008 |
| JP | 2009-218763 | | | 9/2009 |
| WO | WO 2004/004408 | A1 | | 1/2004 |

OTHER PUBLICATIONS

Notice of Rejection mailed by Japan Patent Office on Jun. 14, 2011 in the corresponding Japanese patent application No. 2010-139874.

Notice of Rejection mailed by Japan Patent Office on Sep. 6, 2011 in the corresponding Japanese patent application No. 2010-139874.

Decision of Dismissal of Amendment mailed by Japan Patent Office on Jan. 4, 2012 in the corresponding Japanese patent application No. 2010-139874.

Final Decision of Rejection mailed by Japan Patent Office on Jan. 4, 2012 in the corresponding Japanese patent application No. 2010-139874.

Notice of Rejection mailed by Japan Patent Office on Apr. 24, 2012 in the corresponding Japanese patent application No. 2012-071713, which is a divisional application of JP2010-139874.

* cited by examiner

TELEVISION APPARATUS AND ELECTRONIC DEVICE

CROSS-REFERENCE TO RELATED APPLICATIONS

This application is based upon and claims the benefit of priority from Japanese Patent Application No. 2010-139874, filed Jun. 18, 2010, the entire contents of which are incorporated herein by reference.

FIELD

Embodiments described herein relate generally to a television apparatus and an electronic device.

BACKGROUND

There have been known electronic devices that house a speaker inside the housing and that emit sound produced from the speaker to the outside of the housing. Some of such electronic devices comprise a speaker holder that holds a speaker and that is installed in the housing with an engagement mechanism. Speakers are relatively easily installed in such electronic devices.

Electronic devices are required to favorably emit sound produced from the speaker to the outside of the housing.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Figure 1:
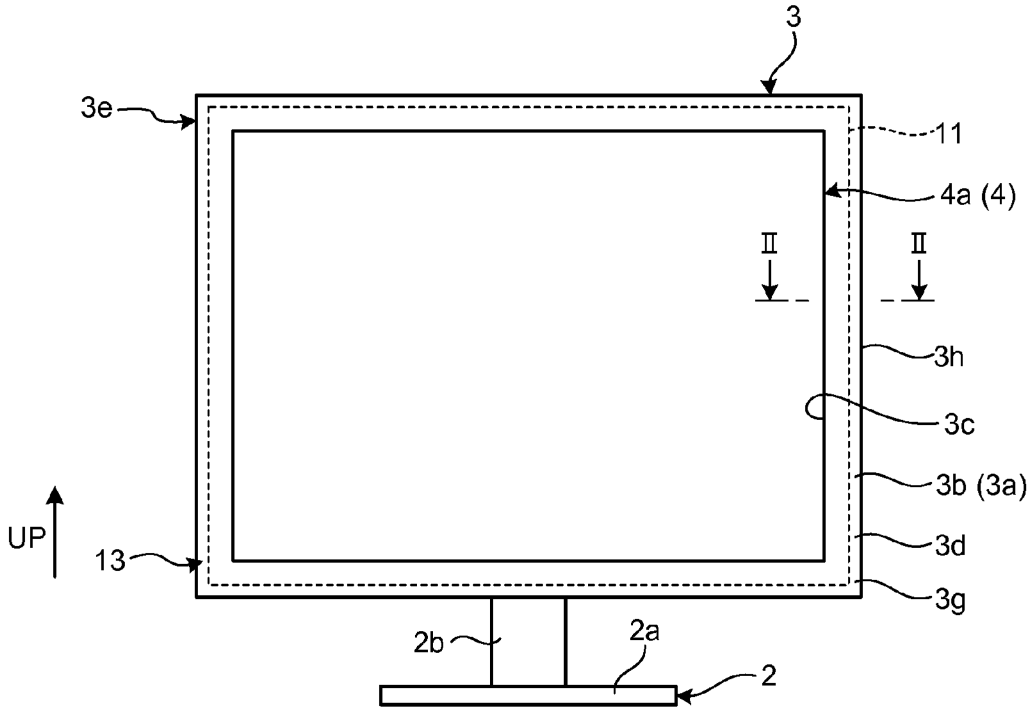
FIG. 1 is an exemplary front view of a television apparatus as an electronic device according to a first embodiment.

In general, according to one embodiment, a television apparatus comprises a housing, a skeletal member, a speaker, a speaker holder, and a sound guiding mechanism. The housing is provided with an emission opening. The skeletal member is configured to be housed in the housing and fixed to the housing. The speaker is configured to be arranged inside the housing. The speaker holder is configured to be attached to the skeletal member with an engagement mechanism while holding the speaker. The sound guiding mechanism comprises the speaker holder, and is configured to guide sound produced from the speaker to the emission opening.

According to another embodiment, an electronic device comprises a housing, a skeletal member, a speaker, a speaker holder, and a sound guiding mechanism. The housing is provided with an emission opening. The skeletal member is configured to be housed in the housing and fixed to the housing. The speaker is configured to be arranged inside the housing. The speaker holder is configured to be attached to the skeletal member with an engagement mechanism while holding the speaker. The sound guiding mechanism comprises the speaker holder, and is configured to guide sound produced from the speaker to the emission opening.

In embodiments described below, identical constituent elements are referred to by the same reference numerals, and repetition is avoided in the explanation of such constituent elements. In the accompanying drawings, "UP" represents the upper side in the operating state.

As illustrated in FIG. 1, a television apparatus 1 as an electronic device according to a first embodiment comprises a stand 2 and a main body 3 that is supported by the stand 2.

The stand 2 has a base 2*a* and a leg 2*b* that upwardly extends from the base 2*a* to the rear side of the central portion of the main body 3. The tail end (rear end) (not illustrated) of a housing 3*a* of the main body 3 is rotatably supported by the fore-end (not illustrated) of the leg 2*b* via a hinge mechanism (not illustrated) including, for example, ball joints or universal joints.

The main body 3 comprises a housing 3*a*, a display panel 4 such as a liquid crystal display (LCD), a circuit board (not illustrated), and a speaker 10 (see FIG. 2) for audio output. The display panel 4 is a display device (display) having a display screen 4*a* exposed anteriorly from an opening 3*c* formed in a front surface 3*b* of the housing 3*a*. The circuit board has electronic components such as a central processing unit (CPU) mounted thereon. The circuit board and the display panel 4 correspond to housing members housed inside the housing 3*a*.

The housing 3*a* is formed in a rectangular flat shape and has the opening 3*c* formed in the front surface 3*b* thereof. A mask 3*d* and a case 3*e* are joined to constitute the housing 3*a*. The housing 3*a* comprises a rear wall 3*f*, a front wall 3*g* that lies at the front of the rear wall 3*f* and faces the rear wall 3*f*, and a peripheral wall 3*h* that connects the periphery of the rear wall 3*f* with the periphery of the front wall 3*g*. The opening 3*c* is formed in the front wall 3*g*.

Figure 2:
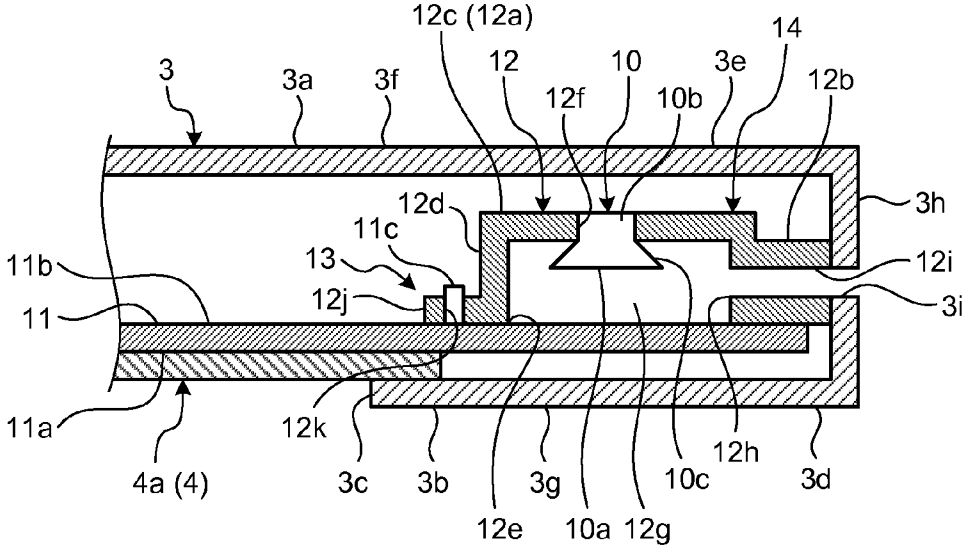
FIG. 2 is an exemplary cross-sectional view along line II-II in FIG. 1 in the first embodiment.

As illustrated in FIGS. 1 and 2, an inner plate 11 as a skeletal member is arranged inside the housing 3*a*. The inner plate 11 is fixed to the rear wall 3*f* of the housing 3*a* via a fixing member such as a screw (not illustrated). The display panel 4 is fixed to a front surface 11*a* of the inner plate 11 via a screw or the like (not illustrated). The inner plate 11 corresponds to a housing member housed inside the housing 3*a*.

The circuit board is arranged at the rear side (back) of the inner plate 11, that is, the rear side of the display panel 4 and is housed in the housing 3*a*. The circuit board is fixed to the rear wall 3*f* of the housing 3*a* via a screw or the like (not illustrated). The circuit board, components (not illustrated) mounted on the circuit board, and other components constitute a circuit board assembly.

The display panel 4 is formed in the shape of a thin and flat rectangular parallelepiped along the front-back direction (perpendicular direction to the plane of paper of FIG. 1). The display panel 4 receives video signals from a video signal processing circuit (not illustrated) that is one of the control circuits (not illustrated) configured with the electronic components mounted on the circuit board and other components, and displays video including still images and moving images on the display screen 4*a* positioned at the front. Apart from the video signal processing circuit, the control circuits in the television apparatus 1 include a tuner module, a high-definition multimedia interface (HDMI) signal processing module, an audio-video (AV) input terminal, a remote control signal receiving module, a controller, a selector, an on-screen display interface, a storage module (such as a read only memory (ROM), a random access memory (RAM), or a hard disk drive (HDD)), and an audio signal processing circuit (all of which are not illustrated).

As illustrated in FIG. 2, the housing 3*a* houses the speaker 10 at one side thereof. The speaker 10 is fixed to the housing 3*a* via a speaker holder 12. The speaker 10 is connected to a speaker control circuit (not illustrated) on the circuit board via a harness (not illustrated) and emits sound from an emitting surface 10*a* by the control of the speaker control circuit. The speaker 10 comprises a substantially cylindrical base 10*b* and an extension 10*c* extending from the base 10*b*, and the emitting surface 10*a* is provided at the extension 10*c*. The extension 10*c* is formed so as to have a larger diameter as being apart from the base 10*b*. The sound produced from the speaker 10 is emitted from an emission opening 3*i* formed in the peripheral wall 3*h* of the housing 3*a* to the outside of the housing 3*a*.

The speaker holder 12 is a component that holds the speaker 10 and that is separately provided from the housing 3*a* and the inner plate 11. The speaker holder 12 is arranged inside the housing 3*a* at one side thereof. The speaker holder 12 is attached to a rear surface 11*b* of the inner plate 11 with an engagement mechanism 13 while holding the speaker 10. The speaker holder 12 is made of an elastic material and thus has elasticity. The speaker holder 12 is a molded component in which components are integrally molded. In the present embodiment, the elastic material is a rubber such as ethylene-propylene rubber (EPDM). However, the elastic material is not limited to the rubber and may be resin or the like other than the rubber. The speaker holder 12 holds the speaker 10 by the fit between them.

Figure 3:
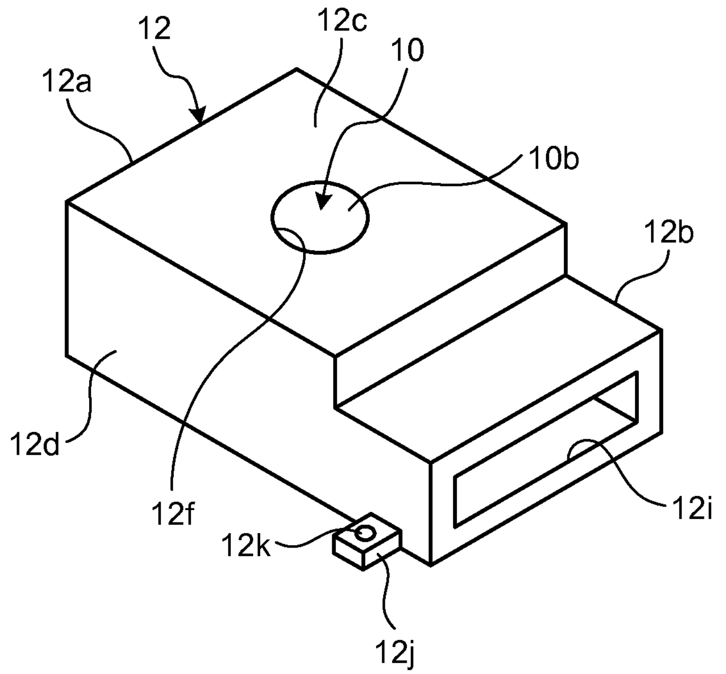
FIG. 3 is an exemplary perspective view of a speaker holder in the first embodiment.
Figure 4:
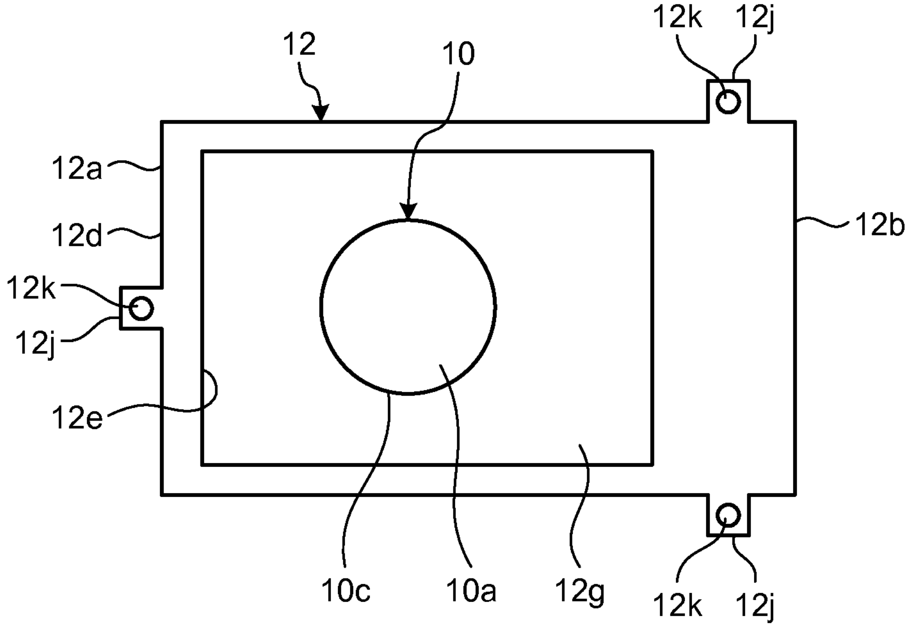
FIG. 4 is an exemplary rear view of the speaker holder in the first embodiment.

As illustrated in FIGS. 2 to 4, the speaker holder 12 has a main body 12*a* in a rectangular parallelepiped shape and an extension 12*b* extending from one side of the main body 12*a*. The main body 12*a* has a holding wall 12*c* as a rear wall apart from the inner plate 11, and a peripheral wall 12*d* extending from the outer edge of the holding wall 12*c* toward the rear surface 11*b* of the inner plate 11. An opening 12*e* is formed in the main body 12*a* at a portion near the inner plate 11. In other words, the opening 12*e* is formed at the front of the speaker holder 12. The opening 12*e* is blocked with the rear surface 11*b* of the inner plate 11. An engaging hole 12*f* fitted with the base 10*b* of the speaker 10 is formed in the holding wall 12*c*, and this fit makes the holding wall 12*c* hold the speaker 10. An air chamber 12*g* is formed inside the main body 12*a*. The air chamber 12*g* serves as a sound field for sound produced from the speaker 10.

The extension 12*b* is formed in a rectangular parallelepiped shape smaller than that of the main body 12*a* and forms a level difference at a connection with the main body 12*a*. The extension 12*b* is formed in a tubular shape. While an inlet 12*h* as an opening at one end of the extension 12*b* is communicated with the inside of the main body 12*a*, an outlet 12*i* as an opening at the other end is communicated with the emission opening 3*i* of the housing 3*a*. The extension 12*b* functions as a duct.

The speaker holder 12 constitutes, together with the inner plate 11, a sound guiding mechanism 14 that guides the sound produced from the speaker 10 to the emission opening 3*i*. In other words, the sound guiding mechanism 14 comprises the speaker holder 12 and guides the sound produced from the speaker 10 to the emission opening 3*i*. The sound guiding mechanism 14 also functions as a sound insulating member that inhibits the sound produced from the rear surface of the speaker 10 from creeping to the front surface (front) of the speaker 10.

The inside space of the sound guiding mechanism 14, except the outlet 12*i*, is substantially sealed to be a box structure. The sound guiding mechanism 14 guides the sound (sound wave) produced from the speaker 10 to the air chamber 12*g*. Thus, the sound produced from the speaker 10 is emitted to the emission opening 3*i* of the housing 3*a*.

As illustrated in FIG. 2, the engagement mechanism 13 attached to the rear surface 11*b* of the inner plate 11 comprises a pin 11*c* installed in a standing manner in the rear surface 11*b* of the inner plate 11, and a fixing piece 12*j* (see FIGS. 3 and 4 as well) that is included in the speaker holder 12 and that is engaged with, specifically, fitted with, the pin 11*c*. The pin 11*c* and the fixing piece 12*j* are both provided in plurality (FIG. 2 illustrates them individually). Specifically, the fixing pieces 12*j* are provided one by one at three side surfaces out of four side surfaces of the speaker holder 12 where the outlet 12*i* is not provided. An engaging hole 12*k* engaged (fitted) with the pin 11*c* is formed in the fixing pieces 12*j*. The engagement mechanism 13 makes the speaker holder 12 detachably attach to the inner plate 11 by the engagement (fit) between them. As described above, in the present embodiment, the speaker holder 12 is attached to the inner plate 11 as a skeletal member with the engagement mechanism 13 while being engaged (fitted) with and holding the speaker 10. As a result, the speaker 10 can relatively easily be attached to the inner plate 11.

As described above, in the present embodiment, the sound guiding mechanism 14 comprising the speaker holder 12 guides the sound produced from the speaker 10 to the emission opening 3*i*. Accordingly, the sound guiding mechanism 14 allows the sound produced from the speaker 10 to be more favorably emitted to the outside of the housings 3*a*. In the present embodiment, a portion of the speaker holder 12 serves also as the sound guiding mechanism 14, and thus, the structure of the television apparatus 1 can be simplified as compared with the structure in which the sound guiding mechanism 14 includes only members except for the speaker holder 12.

In the present embodiment, the speaker holder 12 is attached to the inner plate 11 as a skeletal member with the engagement mechanism 13 while holding the speaker 10. Therefore, the vibration of the speaker 10 can be inhibited from being directly transmitted to the housing 3a. Accordingly, the housing 3a can be inhibited from generating unusual noises. Thus, the sound produced from the speaker 10 can be emitted to the outside of the housings 3a without being disturbed by the unusual noises. Consequently, the sound produced from the speaker 10 can be more favorably emitted to the outside of the housings 3a.

Moreover, in the present embodiment, the speaker holder 12 comprises the air chamber 12g and thus can enhance the sound quality of the speaker 10.

Figure 5:
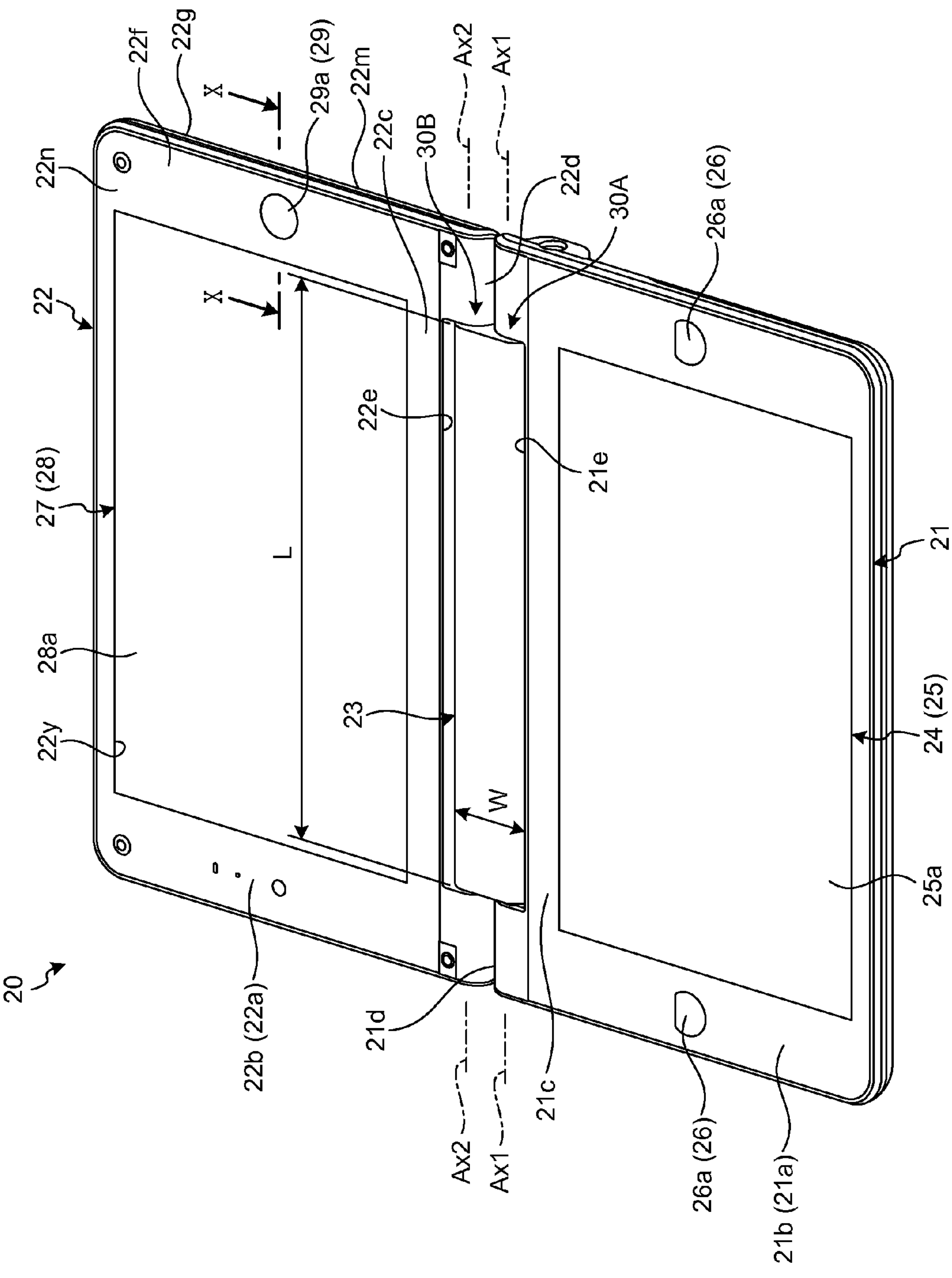
FIG. 5 is an exemplary perspective view of a personal computer (PC) as an electronic device in an open state according to a second embodiment.
Figure 6:
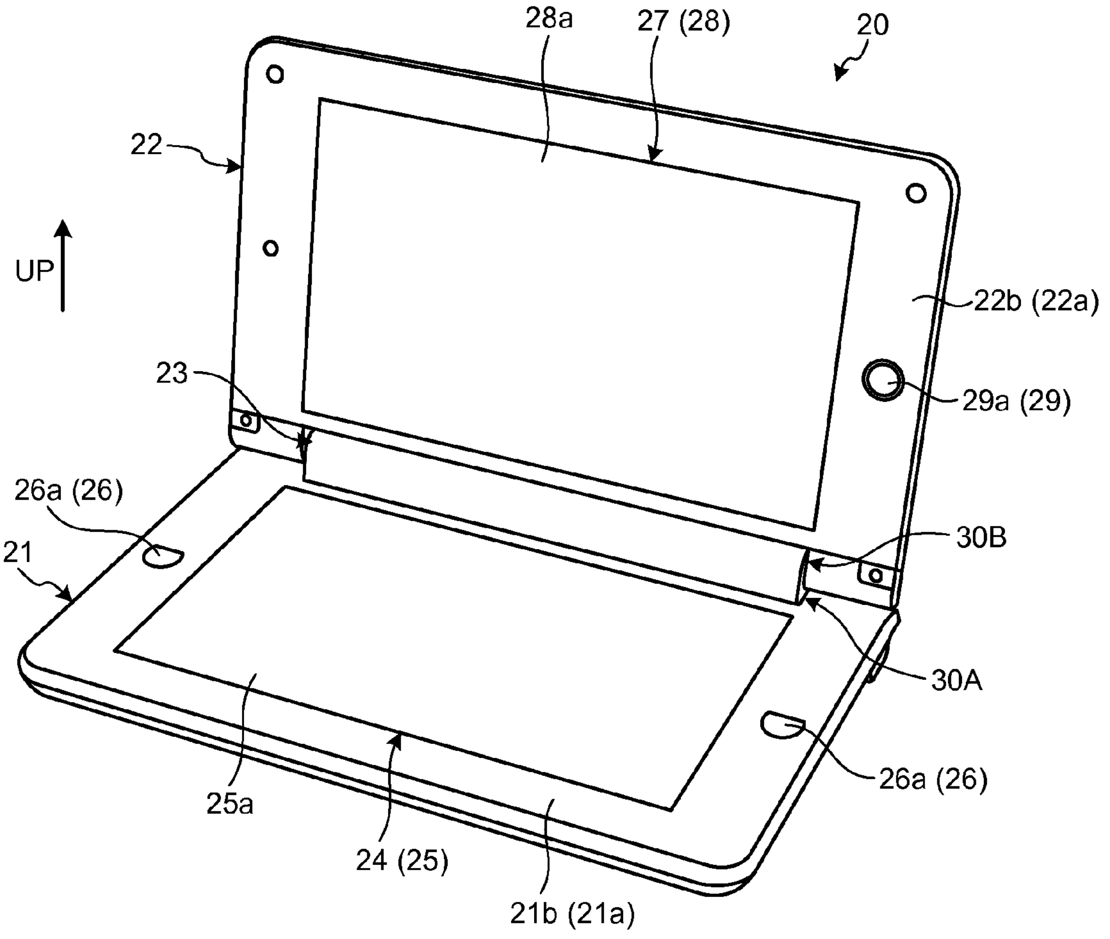
FIG. 6 is an exemplary perspective view of the PC in another open state in the second embodiment.
Figure 7:
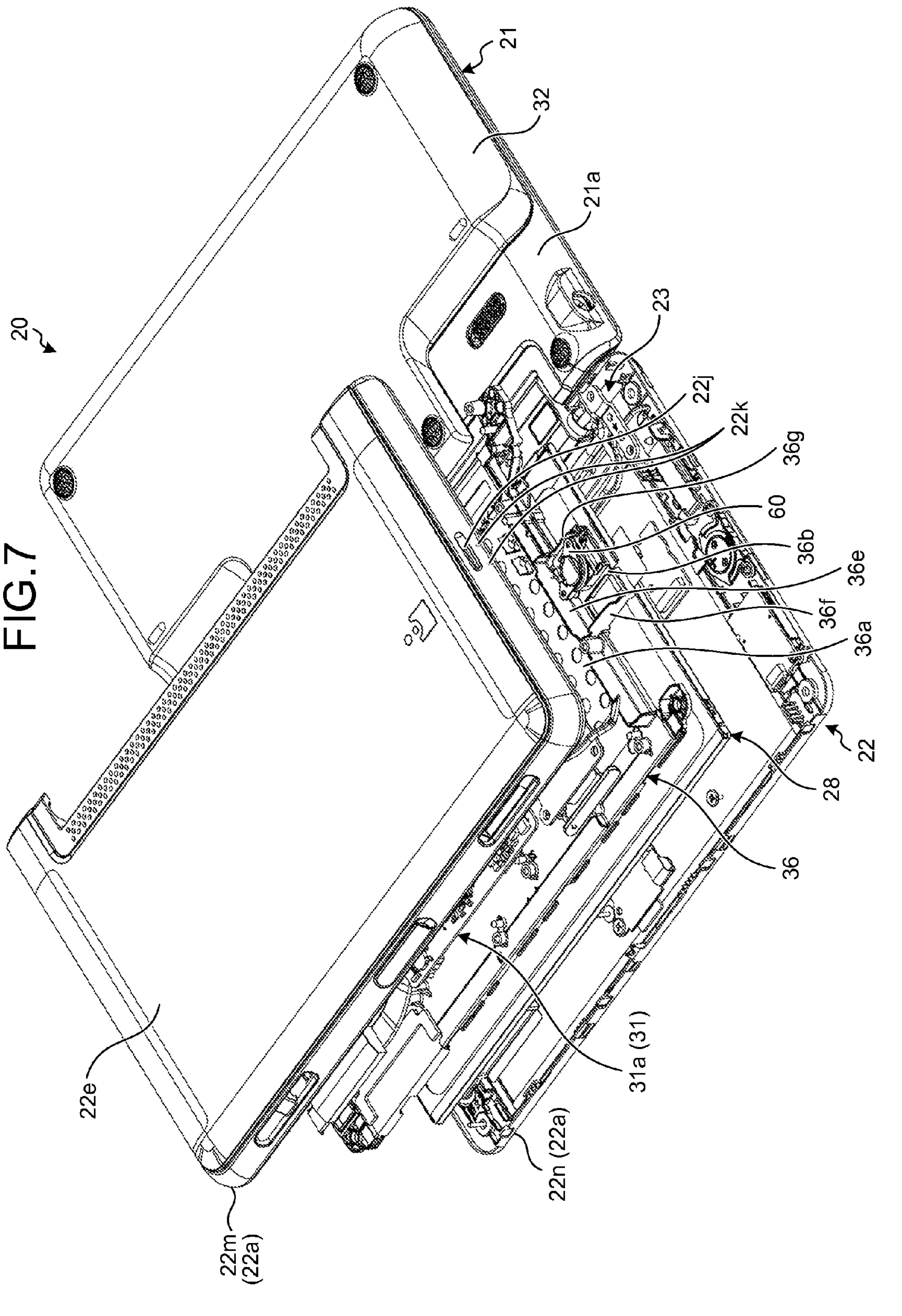
FIG. 7 is an exemplary exploded perspective view of the PC viewed from the rear side in the second embodiment.

As illustrated in FIGS. 5 to 7, a notebook personal computer (PC) 20 as an electronic device according to a second embodiment comprises a rectangular and flat first main body 21 and a rectangular and flat second main body 22. The first main body 21 and the second main body 22 are connected in a relatively rotatable manner via a joint 23.

The PC 20 can be used in a first usage pattern illustrated in FIG. 5 and a second usage pattern illustrated in FIG. 6. As illustrated in FIG. 5, in the first usage pattern, the first main body 21 and the second main body 22 are unfolded relatively widely such as, for example, when a user holds them with both hands. On the other hand, as illustrated in FIG. 6, in the second usage pattern, the first main body 21 and the second main body 22 are unfolded relatively narrowly such as, for example, when they are placed on a desk.

In the first main body 21, a display panel 25 such as LCD that is a display device having a touch panel 24 on the front surface (a display screen 25a), push button mechanisms 26, and the like are provided in an exposed manner on a front surface 21b that is the external surface of a housing 21a. On the other hand, in the second main body 22, a display panel 28 such as LCD that is a display device having a touch panel 27 on the front surface (a display screen 28a), a push button mechanism 29, and the like are provided in an exposed manner on a front surface 22b that is the external surface of a housing 22a. The second main body 22 also comprises a built-in speaker 50 (see FIG. 10) for audio output.

In the open states illustrated in FIGS. 5 and 6, in the PC 20, the display panels 25 and 28, cover bodies 26a and 29a of the push button mechanisms 26 and 29, and the like are exposed so that a user can perform operations. On the other hand, when the PC 20 is in a folded state (not illustrated), the front surfaces 21b and 22b closely face each other in such a way that the display panels 25 and 28, the cover bodies 26a and 29a of the push button mechanisms 26 and 29, and other components are covered by the housings 21a and 22a. In the present embodiment, the touch panels 24 and 27, the push button mechanisms 26 and 29, a microphone (not illustrated), and other components function as input modules, while the display panels 25 and 28, the speaker 50, and other components function as output modules. In a PC having a keyboard, a click button, a pointing device, or the like (not illustrated), the keyboard, the click button, or the like also functions as an input module.

The joint 23 connects the first main body 21 with the second main body 22 and is configured separately from the first main body 21 and the second main body 22. The joint 23 connects an end portion 21c at the base end of the first main body 21 with an end portion 22c at the base end of the second main body 22. Rectangular notches 21e and 22e each having a long opening along the longitudinal direction of end edges 21d and 22d of the end portions 21c and 22c, respectively, and a shallow depth are formed at the center in the longitudinal direction, except at both ends in the longitudinal direction. Half of the joint 23 is inserted in the notch 21e and the remaining half thereof is inserted in the notch 22e. A length L of the joint 23 is set to be slightly shorter than the width of the notches 21e and 22e. Moreover, a width W of the joint 23 is set to be substantially equal to the total thickness of the first main body 21 and the second main body 22 that are closed together in the folded state.

The first main body 21 and the joint 23 are connected to be relatively rotatable around a rotation axis Ax1 via a first hinge mechanism 30A. Similarly, the second main body 22 and the joint 23 are connected to be relatively rotatable around a rotation axis Ax2 via a second hinge mechanism 30B. The rotation axes Ax1 and Ax2 lie parallel to each other. In the present embodiment, the first hinge mechanism 30A and the second hinge mechanism 30B are interlocked so that the relative rotation angle around the rotation axis Ax1 of the first main body 21 with respect to the joint 23 is identical to the relative rotation angle around the rotation axis Ax2 of the second main body 22 with respect to the joint 23. However, the two relative rotation directions with respect to the joint 23 are opposite to each other. Thus, when a user opens either one of the first main body 21 and the second main body 22 relative to the joint 23, the PC 20 falls into the open state. On the other hand, when the user closes either one of the first main body 21 and the second main body 22 relative to the joint 23, the PC 20 falls into the folded state. Moreover, when a user opens both the first main body 21 and the second main body 22, the PC 20 falls into the open state. On the other hand, when a user closes both the first main body 21 and the second main body 22, the PC 20 falls into the folded state.

Figure 8:
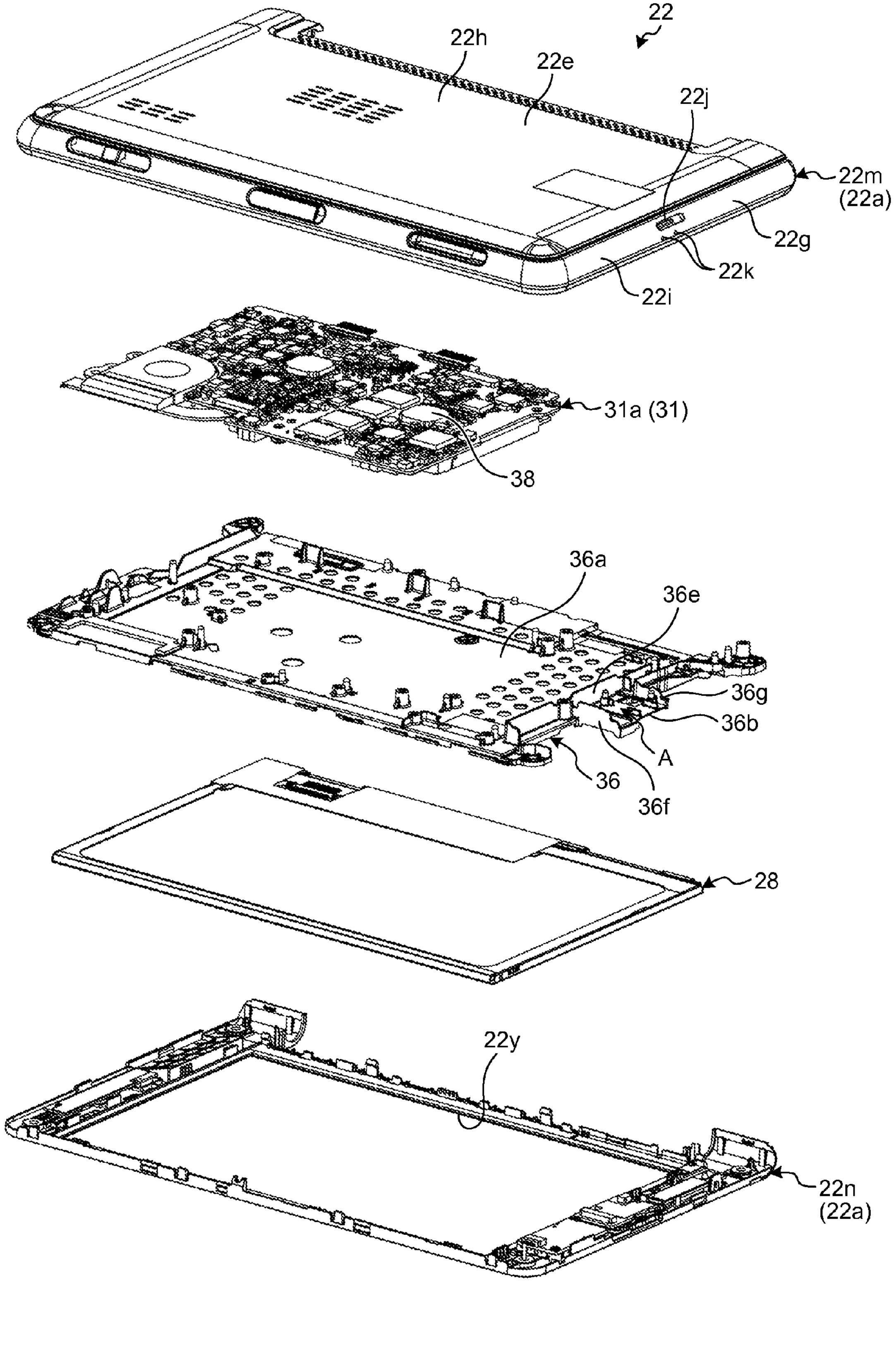
FIG. 8 is an exemplary exploded perspective view of a second main body of the PC viewed from the rear side in the second embodiment.
Figure 9:
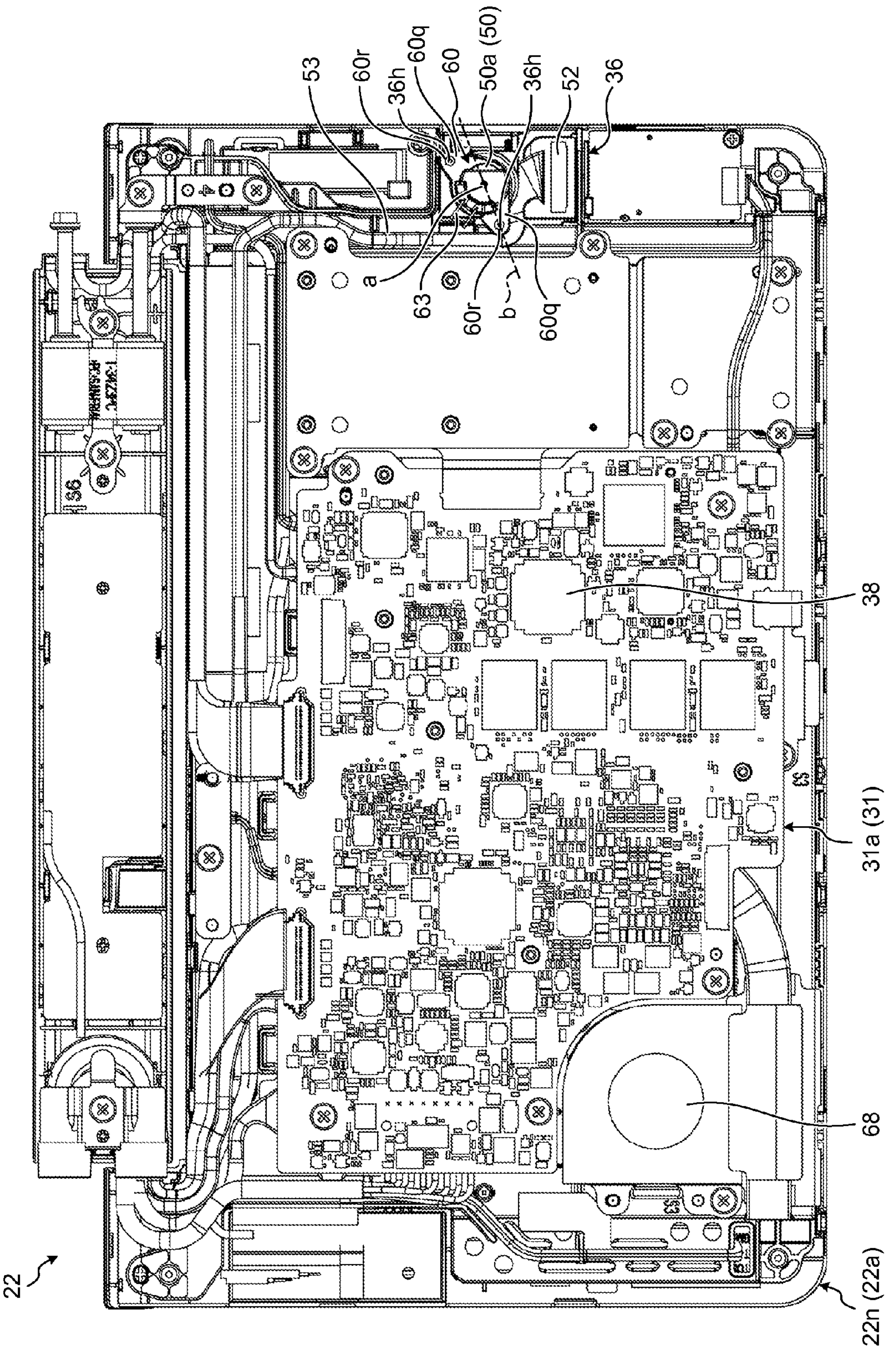
FIG. 9 is an exemplary rear view of the second main body of the PC in which a case of the second main body is not illustrated in the second embodiment.

As illustrated in FIGS. 7 to 9, in the present embodiment, a circuit board 31a (a circuit board assembly 31) with at least a part of the control circuits comprising electronic components mounted thereon is arranged, for example, inside the housing 22a of the second main body 22. The display panel 28 and the circuit board 31a are fixed to the housing 22a with screws or the like (not illustrated). As illustrated in FIG. 7, in the first main body 21, a battery 32 is arranged as a power supply behind (on the rear side of) the display panel 25. The battery 32 is detachably attached to the housing 21a of the first main body 21. Thus, in the present embodiment, the circuit board 31a (the circuit board assembly 31) with the main electronic components such as a CPU 38 mounted thereon is provided in the second main body 22, while the battery 32 is provided in the first main body 21. In case the circuit board assembly 31 and the battery 32 are disposed together in either one of the first main body 21 and the second main body 22, the following inconveniences are more likely to occur. For example, the thickness of the main body increases or, if there is a restriction on the thickness, the size and eventually the capacity of the battery 32 are more likely to be limited. In this regard, in the present embodiment, the circuit board assembly 31 and the battery 32 are separately provided in the second main body 22 and the first main body 21, respectively. That makes it easier to avoid such inconveniences. In the present embodiment, however, in the second usage pattern illustrated in FIG. 6, the mass of the first main body 21 is larger than that of the second main body 22 so that the PC 20 can be stably placed on a desk or the like. In the present embodiment, the first main body 21 corresponds to a different main body that is connected to the second main body 22, which houses the circuit board assembly 31, in a relatively rotatable manner via the hinge mechanisms 30A and 30B. Moreover, the display screen 25a of the display panel 25 in the first main body 21 corresponds to a different display screen. The circuit board and the display panel correspond to housing members housed inside the housing.

Each of the display panels 25 and 28 is formed in the shape of a flat rectangular parallelepiped. The display panels 25 and 28 receive display signals from control circuits configured with the electronic components or the like that are mounted on the circuit board 31*a* and display video including still images and moving images. Also in the present embodiment, light that represents the video displayed on the display screens 25*a* and 28*a* of the display panels 25 and 28 is output anteriorly through the colorless and transparent touch panels 24 and 27, respectively. The control circuits in the PC 20 comprise a controller, a storage module (such as a read only memory (ROM), a random access memory (RAM), or a hard disk drive (HDD)), an interface circuit, and various controllers.

Figure 10:
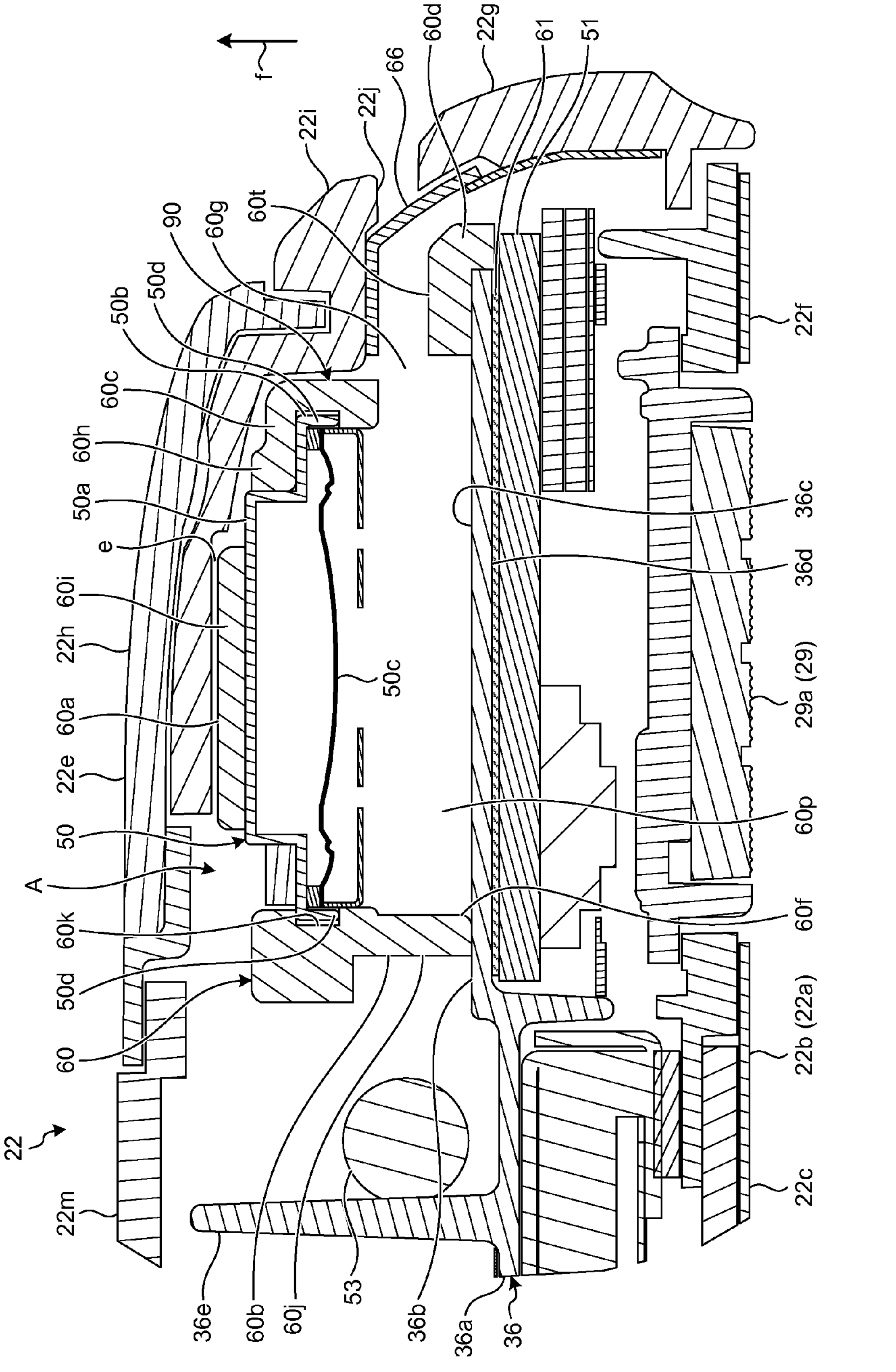
FIG. 10 is an exemplary cross-sectional view along line X-X in FIG. 5 in the second embodiment.
Figure 11:
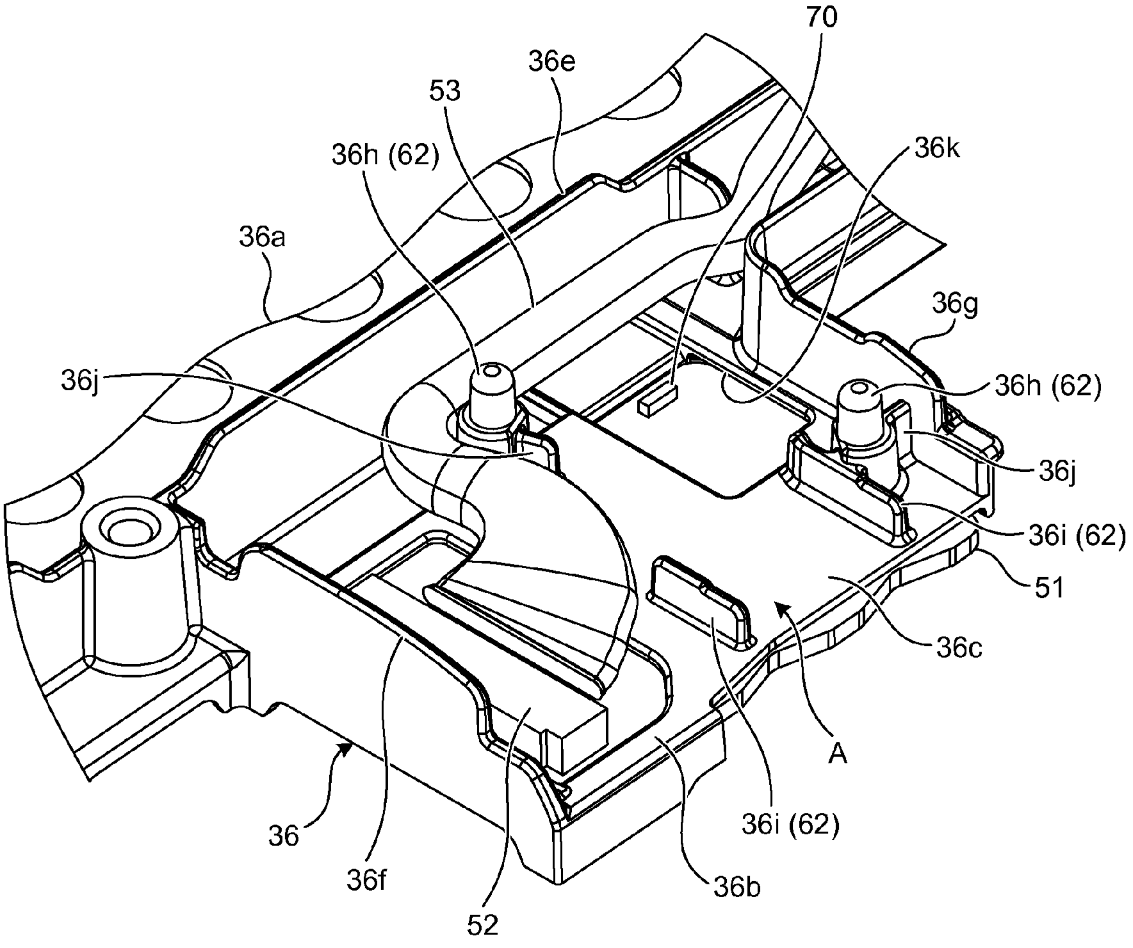
FIG. 11 is an exemplary perspective view of a second plate of an inner plate and a harness viewed from the rear side in the second embodiment.

As illustrated in FIGS. 10 and 11 and other drawings, the second main body 22 comprises a built-in second circuit board 51. Interfaces for the speaker 50 and the push button mechanism 29 are mounted on the second circuit board 51. The second circuit board 51 is connected to the circuit board 31*a* via a harness 53 connected with a connector 52. The push button mechanism 29 is, for example, a power switch. The second circuit board 51 corresponds to a housing member housed inside the housing 22*a*.

As illustrated in FIG. 8 and other drawings, the housing 22*a* of the second main body 22 comprises a mask 22*n* and a case 22*m*. The housing 22*a* comprises a rear wall 22*e*, a front wall 22*f* that lies at the front of the rear wall 22*e* and faces the rear wall 22*e*, and a peripheral wall 22*g* that connects the periphery of the rear wall 22*e* with the periphery of the front wall 22*f*. The rear wall 22*e* is formed with the case 22*m*, the front wall 22*f* is formed with the mask 22*n*, and the peripheral wall 22*g* is formed with the mask 22*n* and the case 22*m*. As illustrated in FIG. 5, an opening 22*y* is formed in the front wall 22*f*. The mask 22*n* and the case 22*m* are integrally coupled by screwing, engagement, fitting, or the like and form the outline of the housing 22*a*. An inner plate 36 as a skeletal member is arranged inside the housing 22*a*. The inner plate 36 is fixed to the mask 22*n* or the case 22*m* (for example, the case 22*m*) by screwing or in other manners. The housing 22*a* houses the display panel 28 that has the display screen 28*a* exposed on the front side, and also houses the circuit board assembly 31. The inner plate 36 is arranged at a position between the display panel 28 and the circuit board 31*a* (the circuit board assembly 31), that is, at a position behind the display panel 28 and in front of the circuit board 31*a*. The circuit board 31*a* is fixed to the inner plate 36 using a screw (not illustrated) that is a fixture. Moreover, the display panel 28 is supported by the inner plate 36 and the mask 22*n*. The inner plate 36 corresponds to a housing member housed inside the housing 22*a*.

As illustrated in FIGS. 8 and 10, the case 22*m* of the housing 22*a* comprises a plate member 22*h* and a peripheral member 22*i* that is welded to the periphery of the plate member 22*h*. An emission opening 22*j* through which the sound produced from the speaker 50 is emitted to the outside of the housing 22*a* and an opening 22*k* for a lamp such as a light-emitting diode (LED) (not illustrated) are formed in the peripheral member 22*i* constituting the side of the housing 22*a*.

Figure 12:
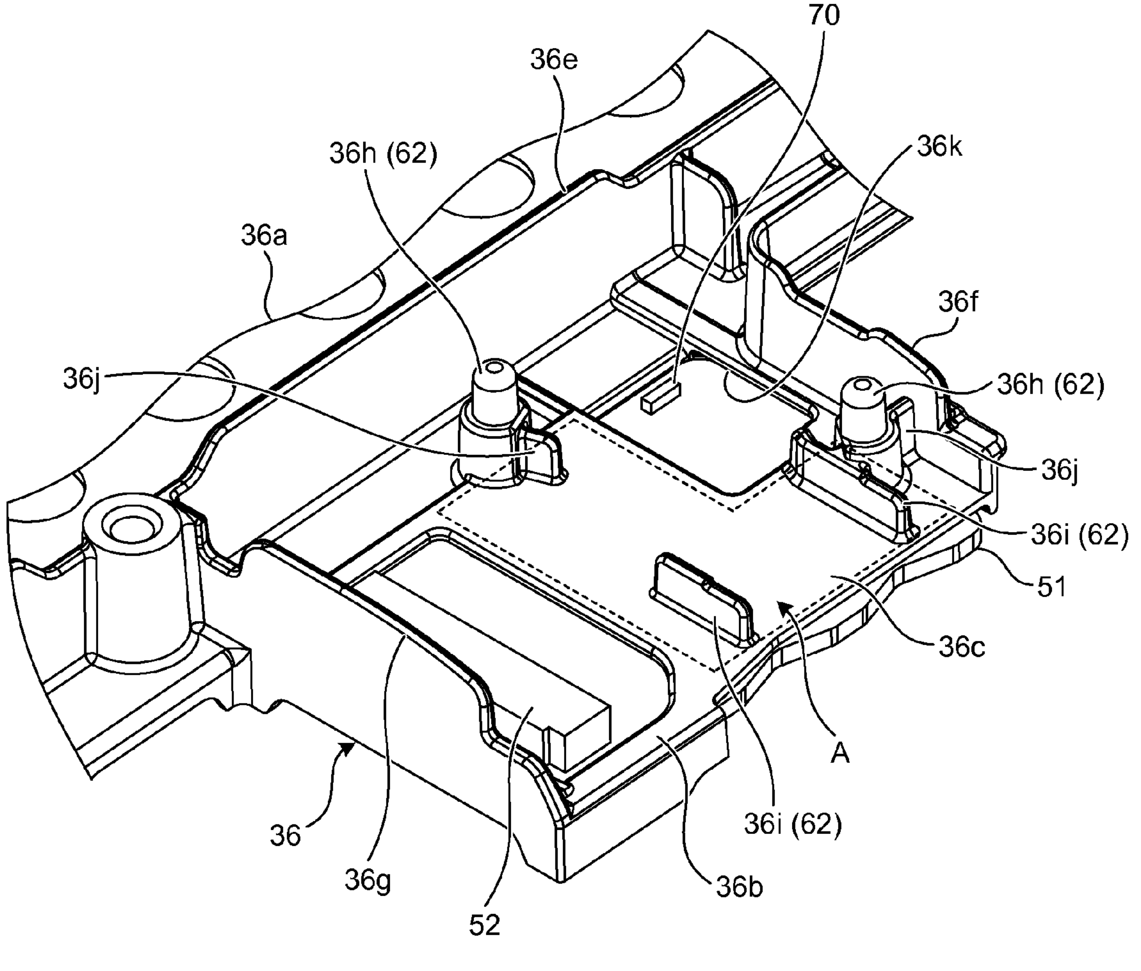
FIG. 12 is an exemplary perspective view of the second plate of the inner plate viewed from the rear side in the second embodiment.

As illustrated in FIGS. 8, 11, and 12, the inner plate 36 has a main body 36*a* in a substantially rectangular flat shape and an extension 36*b* that is formed extending from the side of the main body 36*a* and that has a substantially rectangular flat shape. As illustrated in FIG. 10, the speaker 50 is attached to a rear surface (back surface) 36*c* of the extension 36*b* as a supporting surface via a speaker holder 60. On the other hand, the second circuit board 51 is bonded to a front surface (fore) 36*d* of the extension 36*b* using a double-faced tape 61 as a fixing module. The fixing module may be an adhesive. As illustrated in FIGS. 11 and 12, a rib 36*e* is installed in a standing manner at a position between the main body 36*a* and the extension 36*b* and is arranged at the outside of a mounting area A of the speaker holder 60. A pair of ribs 36*f* and 36*g* that is different from the rib 36*e* is arranged so as to face each other at the extension 36*b* outside of the mounting area A of the speaker holder 60. The pair of ribs 36*f* and 36*g* and the rib 36*e* surround the mounting area A of the speaker holder 60.

As illustrated in FIGS. 11 and 12, a pair of pins 36*h* as an engaging portion and a pair of ribs 36*i* are installed in the rear surface 36*c* of the extension 36*b* as a supporting surface in a standing manner, and constitute an engagement mechanism 62 with which the speaker holder 60 is engaged with the inner plate 36. While one of the pins 36*h* is installed in the base of the extension 36*b* in a standing manner, the other of the pins 36*h* is installed in the fore-end of the extension 36*b* in a standing manner. Each of ribs 36*j* is provided at the pins 36*h*. The pair of ribs 36*i* is arranged in parallel at the fore-end of the extension 36*b* and faces each other. One of the ribs 36*i* is adjacently arranged at the other of the pins 36*h* installed at the fore-end of the extension 36*b* in a standing manner.

An opening 36*k* from which a portion of the second circuit board 51 is exposed to the rear surface 36*c* of the inner plate 36 (to the speaker 50) is formed in the extension 36*b*. The opening 36*k* is communicated with the inside of the speaker holder 60. A harness 63 (see FIG. 9) of the speaker 50 is inserted through the opening 36*k*. The second circuit board 51 is arranged at a position facing the opening 36*k*. In other words, the second circuit board 51 is arranged so as to face the opening 36*k* and be overlapped with the front surface 36*d* that is the opposite surface of the rear surface 36*c* (supporting surface) of the inner plate 36.

As illustrated in FIG. 10, the housing 22*a* houses at one side thereof, the speaker 50. The speaker 50 is fixed to the inner plate 36 via the speaker holder 60. The speaker 50 is connected to a speaker control circuit (not illustrated) on the circuit board via the harness 63 (see FIG. 9) and emits sound from the emitting surface by the control of the speaker control circuit. The speaker 50 has a substantially cylindrical base 50*a* and an extension 50*b* extending from the base 50*a*, and an emitting surface 50*c* is provided at the extension 50*b*. The sound produced from the speaker 50 is emitted through the emission opening 22*j* formed in the peripheral wall 22*g* of the housing 22*a* to the outside of the housing 22*a*.

The speaker holder 60 is a component that holds the speaker 50 and that is separately provided from the housing 22*a* and the inner plate 36. The speaker holder 60 is arranged inside the housing 22*a* at one side thereof and is attached to the rear surface 36*c* of the inner plate 36 as a supporting surface. The speaker holder 60 is made of an elastic material and thus has elasticity. The speaker holder 60 is a molded component in which components are integrally molded. In the present embodiment, the elastic material is a rubber such as ethylene-propylene rubber (EPDM). However, the elastic material is not limited to the rubber and may be resin or the like, other than the rubber. The speaker holder 60 holds the speaker 50 by the fit between them.

Figure 13:
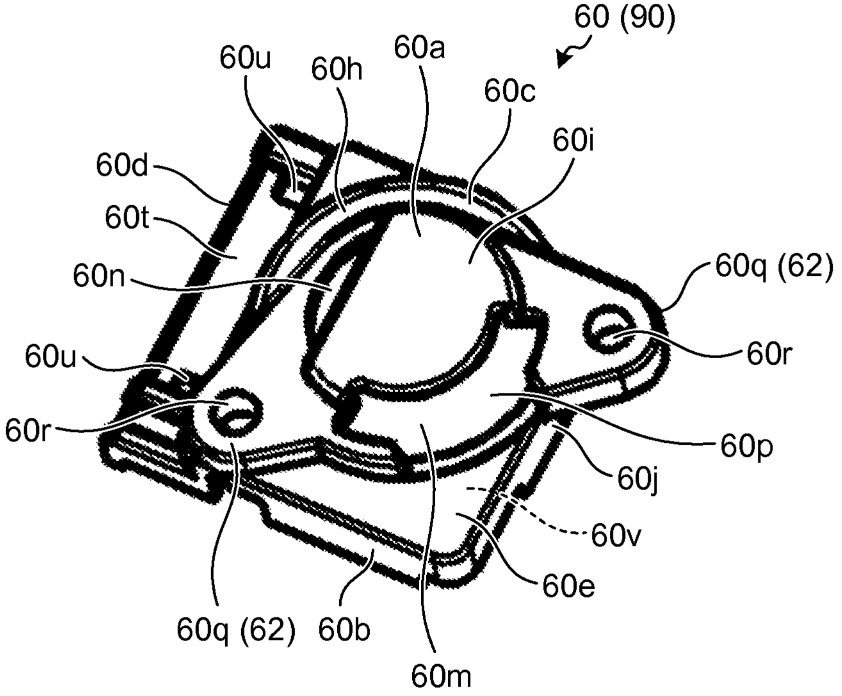
FIG. 13 is an exemplary perspective view of a speaker holder viewed from the front side in the second embodiment.
Figure 14:
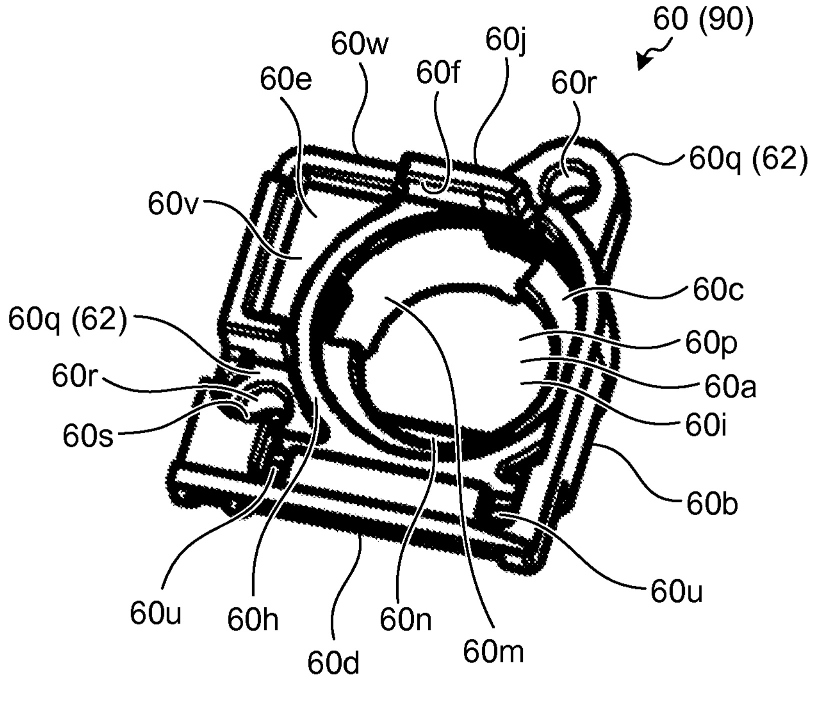
FIG. 14 is an exemplary perspective view of the speaker holder viewed from the rear side in the second embodiment.

As illustrated in FIGS. 10, 13, and 14, the speaker holder 60 has a rear wall 60*a* as a base wall, and a side wall (peripheral wall) 60*b* connected to the rear wall 60*a*, and the side wall 60*b* abuts the rear surface 36*c* of the inner plate 36. Specifically, the speaker holder 60 comprises a substantially cylindrical main body 60*c* for holding the speaker 50, an extension 60*d* extending from one side of the main body 60*c*, and an expanded portion 60*e* connected to the main body 60*c*. An opening 60*f* is formed in the speaker holder 60 at a portion close to the inner plate 36. In other words, the opening 60*f* is formed at a front surface (fore) of the speaker holder 60. The opening 60*f* is blocked with the rear surface 36*c* of the inner plate 36. An outlet 60*g* is formed at a position between the main body 60*c* and the extension 60*d* of the speaker holder 60 and faces the emission opening 22*j* of the housing 22*a*.

The main body 60*c* comprises a stepped cylindrical fitting portion 60*h* and a covering wall 60*i* that covers a portion of the rear surface of the fitting portion 60*h* and is connected to the fitting portion 60*h*.

A portion of the fitting portion 60*h* extends to the inner plate 36 to constitute a leg 60*j*, and the leg 60*j* constitutes the side wall 60*b* of the speaker holder 60. A circular concave portion 60*k* is formed at the inner periphery of the fitting portion 60*h*, and the concave portion 60*k* and a circular fitting piece 50*d* formed at the extension 50*b* of the speaker 50 are fitted together.

The covering wall 60*i* constitutes the rear wall 22*e*. The covering wall 60*i* abuts the rear surface of the speaker 50. A first harness inserting opening 60*m* through which the harness 63 passes is formed in the covering wall 60*i*. In addition to the first harness inserting opening 60*m*, an opening 60*n* is formed in the covering wall 60*i*.

A first air chamber 60*p* is formed inside the main body 60*c*. The first air chamber 60*p* serves as a sound field for sound produced from the speaker 50. The first air chamber 60*p* is blocked by the rear surface 36*c* of the inner plate 36 as a supporting surface and the second circuit board 51.

Two fixing pieces 60*q* constituting the engagement mechanism 62 are connected to the main body 60*c*. These fixing pieces 60*q* extend from the covering wall 60*i* of the main body 60*c* to the outside of the fitting portion 60*h*. Fitting holes 60*r* are formed at the fore-ends of the fixing pieces 60*q*, and the pins 36*h* are fitted into the fitting holes 60*r*. As illustrated in FIG. 9, the two fixing pieces 60*q* are arranged so that one of the fitting holes 60*r* is displaced from a straight line b passing through both a cylindrical shaft center a of the main body 60*c* and the other of the fitting holes 60*r* as viewed along the direction (perpendicular direction to the plane of paper of FIG. 9) of the cylindrical shaft center of the main body 60*c*. A pin abutting portion 60*s* formed along the outside shape of the pin 36*h* is connected to one of the fixing pieces 60*q* and abuts the pin 36*h* to fill the gap between the speaker holder 60 and the pin 36*h*. In other words, the pin abutting portion 60*s* that is at least a portion of the speaker holder 60 is formed as a housing member constituting a sound guiding mechanism 90 along the pin 36*h* of the inner plate 36 and abuts the pin 36*h*. One of the fixing pieces 60*q* is fitted with the pin 36*h* and abuts the harness 63 to position the harness 63.

A grooved path 60*t* communicated with the outlet 60*g* and the emission opening 22*j* is formed in the extension 60*d*. As illustrated in FIG. 10, the fore-end of the extension 60*d* and the edge of the inner plate 36 are caught together to position the fore-end. A pair of engaging holes 60*u* constituting the engagement mechanism 62 is formed in the extension 60*d* and is engaged with the pair of ribs 36*i* formed on the inner plate 36. The engaging holes 60*u* correspond to rib engaging portions.

The expanded portion 60*e* constitute the rear wall 60*a* and the side wall 60*b* of the speaker holder 60. A second air chamber 60*v* is formed inside the expanded portion 60*e*. The second air chamber 60*v* is blocked by the rear surface 36*c* of the inner plate 36 as a supporting surface and the second circuit board 51. The first air chamber 60*p* is communicated with the second air chamber 60*v* and serves as a sound field for sound produced from the speaker 50. A notch 60*w* is formed in the expanded portion 60*e*, and a connector 70 (see FIG. 11) of the second circuit board 51 is connected with the harness 63 through the notch 60*w*. One of the fixing pieces 60*q* is provided at a portion between the expanded portion 60*e* and the extension 60*d*.

The speaker holder 60 constitutes, together with the inner plate 36 and the second circuit board 51, the sound guiding mechanism 90 that guides the sound produced from the speaker 50 to the emission opening 22*j*. In other words, the sound guiding mechanism 90 comprises the speaker holder 60 and guides the sound produced from the speaker 50 to the emission opening 22*j*. The sound guiding mechanism 90 comprises the inner plate 36 and the second circuit board 51 as at least one of the housing members. The speaker holder 60 is apart from the inner surface of the housing 22*a*.

The inside space of the sound guiding mechanism 90, except the outlet 60*g*, is substantially sealed to be a box structure. The sound guiding mechanism 90 guides the sound (sound wave) produced from the speaker 50 to the air chamber 12*g*. Thus, the sound produced from the speaker 50 is emitted to the emission opening 22*j* of the housing. The speaker holder 60 also functions as a sound insulating member that inhibits the sound produced from the rear surface of the speaker 50 from creeping to the front surface of the speaker 50.

As described above, the inner plate 36 has the rear surface 36*c* of the inner plate 36 as a supporting surface and the pair of pins 36*h* as an engaging portion. The speaker holder 60 is arranged at a position between the inner plate 36 and the housing 22*a* and lies at a fixing position where the speaker holder 60 abuts the rear surface 36*c* of the inner plate 36 and is engaged with the pins 36*h*. A gap e (FIG. 10) is formed between the speaker holder 60 and the housing 22*a* when the speaker holder 60 lies at the fixing position. When the speaker holder 60 moves (is displaced) from the fixing position toward the housing 22*a* (an arrow f direction illustrated in FIG. 10), the housing 22*a* abuts the speaker holder 60 to restrict the movement of the speaker holder 60.

A filter member 66 covers the emission opening 22*j*. The filter member 66 is, for example, nonwoven fabric and is fixed to the inner surface of the housing 22*a* by bonding or the like.

Figure 15:
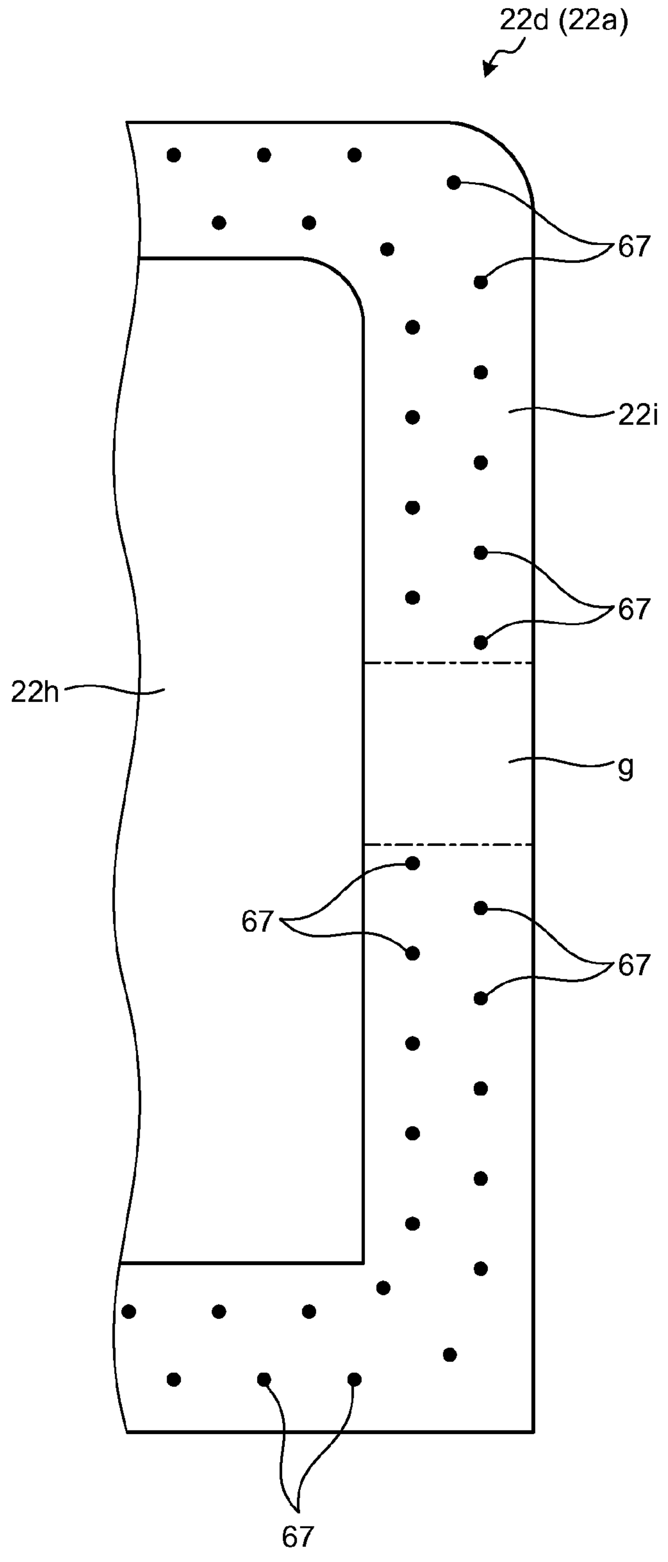
FIG. 15 is an exemplary rear view of the inside of a housing in the second embodiment.

As illustrated in FIG. 15, in the present embodiment, the peripheral member 22*i* and the plate member 22*h* are not welded at an area g facing the speaker holder 60 in the case 22*m*, and welding portions 67 are arranged at portions except for the area g.

As illustrated in FIG. 9, while the speaker 50 is arranged at one side of the second main body 22, a fan mechanism 68 as a heat exhausting mechanism is arranged at the other side of the second main body 22. Thus, the speaker 50 positions relatively away from the fan mechanism 68, which can inhibit the influence of the sound made from the fan mechanism 68 on the speaker 50.

As described above, in the present embodiment, the sound guiding mechanism 90 comprising the speaker holder 60 guides the sound produced from the speaker 50 to the emission opening 22*j*. Accordingly, the sound guiding mechanism 90 allows the sound produced from the speaker 50 to be more favorably emitted to the outside of the housings 22*a*. In the present embodiment, a portion of the speaker holder 60 serves also as the sound guiding mechanism 90, and thus, the structure of the PC 20 can be simplified as compared with the structure in which the sound guiding mechanism 90 includes only members except for the speaker holder 60.

In the present embodiment, the speaker holder 60 is attached to the inner plate 36 as a skeletal member with the engagement mechanism 62 while holding the speaker 50. Therefore, the vibration of the speaker 50 can be inhibited from being transmitted to the housing 22*a*. Accordingly, the housing 22*a* can be inhibited from generating unusual noises. Thus, the sound produced from the speaker 50 is emitted to the outside of the housings 22*a* without being disturbed by the unusual noises. In other words, the sound produced from the speaker 50 can be more favorably emitted to the outside of the housings 22*a*.

Moreover, in the present embodiment, the first and the second air chambers 60*p* and 60*v* that are provided in the speaker holder 60 can enhance the sound quality of the speaker 50.

In the present embodiment, the speaker holder 60 has elasticity. Therefore, the speaker holder 60 can come in contact with the inner plate 36, which can inhibit sound leakage generating from a gap between the speaker holder 60 and the inner plate 36.

In the present embodiment, the pin abutting portion 60*s* that is at least a portion of the speaker holder 60 is formed along the inner plate 36 as a housing member constituting the sound guiding mechanism 90 and abuts the inner plate 36 (pin 36*h*). Therefore, the speaker holder 60 can come in contact with the inner plate 36, which can inhibit sound leakage generating from a gap between the speaker holder 60 and the inner plate 36.

In the present embodiment, the ribs 36*i* are provided at the inner plate 36 constituting the sound guiding mechanism 90, and the engaging holes 60*u* engaged with the ribs 36*i* are formed in the speaker holder 60. This structure can inhibit the deformation of the inner plate 36.

In the present embodiment, the inner plate 36 as a skeletal member has the rear surface 36*c* as a supporting surface and the pins 36*h* as engaging portions. The speaker holder 60 is arranged at a position between the inner plate 36 and the housing 22*a* and lies at a fixing position where the speaker holder 60 abuts the rear surface 36*c* and is engaged with the pins 36*h*. A gap is formed between the speaker holder 60 and the housing 22*a* when the speaker holder 60 lies at the fixing position. When the speaker holder 60 moves from the fixing position toward the housing 22*a*, the housing 22*a* abuts the speaker holder 60 to restrict the movement of the speaker holder 60. Therefore, the speaker holder 60 can be inhibited from being largely displaced in the housing 22*a*.

In the present embodiment, the inner plate 36 as a skeletal member has the rear surface 36*c* as a supporting surface abutting the speaker holder 60. The opening 36*k* communicated with the inside of the speaker holder 60 is provided at the rear surface 36*c*. The second circuit board 51 is arranged so as to face the opening 36*k* and be overlapped with the opposite surface of the rear surface 36*c* (the front surface 36*d*) of the inner plate 36. The second circuit board 51 and the inner plate 36 are bonded with each other by the double-faced tape 61 that is a bonding member positioning between the second circuit board 51 and the inner plate 36. Thus, sound leakage generating from a gap between second circuit board 51 and the inner plate 36 can be inhibited.

Figure 16:
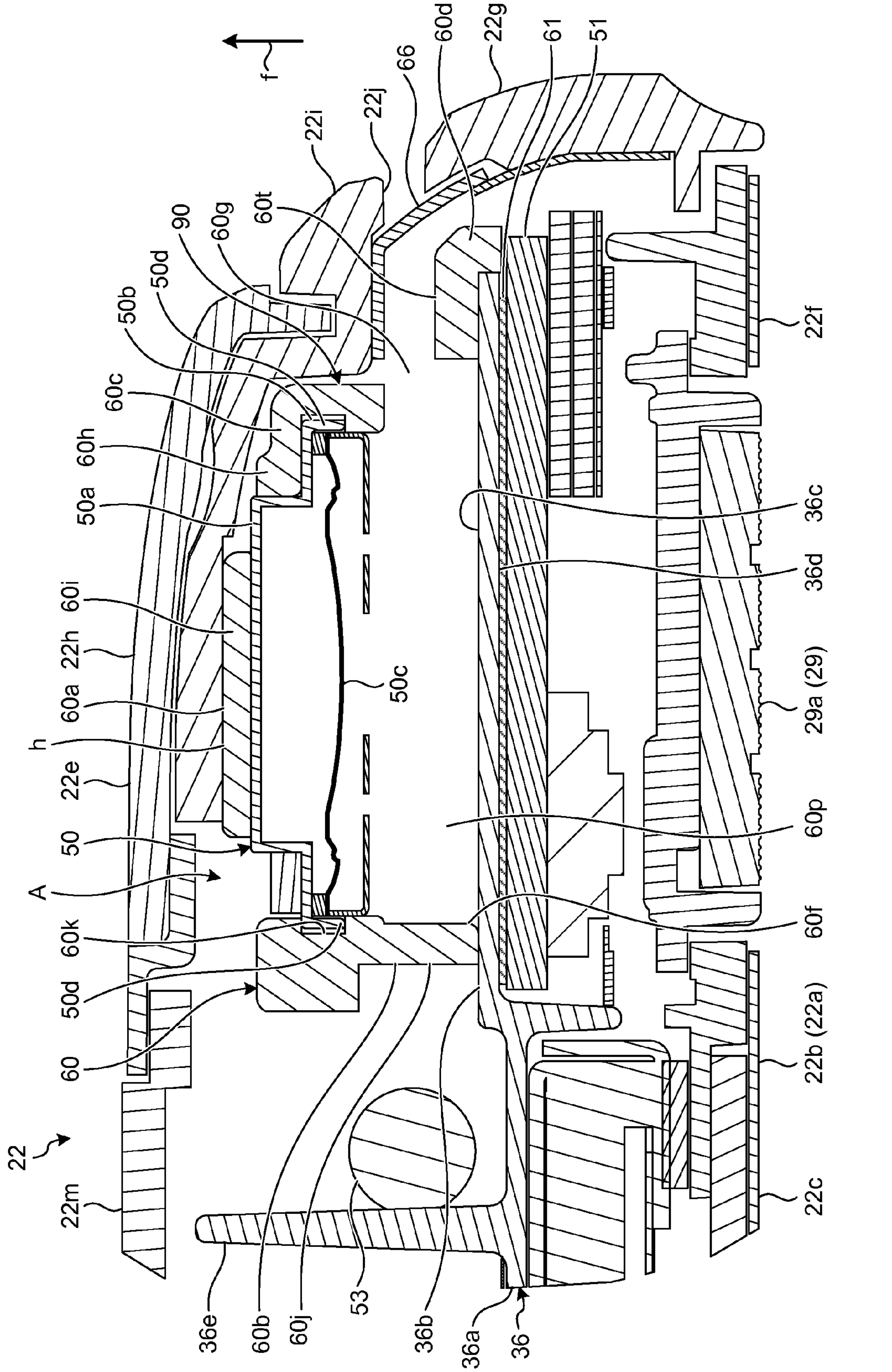
FIG. 16 is an exemplary cross-sectional view of a second main body of a PC according to a third embodiment.

As illustrated in FIG. 16, the structure of a third embodiment is the same as that of the second embodiment except that the speaker holder 60 abuts the inner surface of the housing 22*a*. The abutting portion is indicated with a reference numeral h in FIG. 16. In other words, in the present embodiment, the speaker holder 60 is arranged at a position between the housing 22*a* and the inner plate 36 as a skeletal member, abuts both the housing 22*a* and the inner plate 36, and thus restrict its movement.

Such a structure allows the speaker holder 60 to be inhibited from being displaced in the housing 22*a*.

As described above, according to each of the embodiments, television apparatuses and electronic devices that can favorably emit sound produced from the speakers to the outside of the housings can be obtained.

While the abovementioned embodiments are described as being applied to a television apparatus and a notebook PC having two display screens, the embodiments may also be applicable to other electronic devices having at least a single display screen such as computers (notebook computers or desktop computers), personal digital assistants (PDAs), smartbooks, smartphones, or cellular phones, having a single display screen.

Moreover, regarding the display device, the display screen, the display panel, the housing, the circuit board, the second circuit board, the inner plate, the speaker, the speaker holder, the electronic component, the fan, the pin, the rib, and the like, the specifications (method, structure, shape, material, size, number, direction, type, arrangement, etc.) can be suitably modified.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:

a housing provided with an emission opening at a side face thereof;

a housing member housed in the housing and fixed to a face of the housing at which the emission opening is not provided;

a speaker housed in the housing, and comprising an emission portion facing toward a direction intersecting a direction in which the emission opening is opened and facing a closed surface of the housing member at which no through hole connecting to an outside of the housing is provided; and a speaker holder housed in the housing, attached to the housing member while holding speaker, extending between the speaker and the closed surface, and provided with an opening covered by the closed surface facing toward the emission portion and an opening facing the emission opening from one side portion thereof between the speaker and the closed surface, wherein the speaker holder is a component comprising a part holding the speaker at a position apart from and opposite the housing member and a wall extending from the part toward a side of the closed surface, and provided with an opening covered by the closed surface facing toward the emission portion and an opening facing the emission opening, and the opening facing the emission opening is opened at a position nearer to a side of the speaker than the closed surface.

2. The electronic device of claim 1, wherein the component has elasticity.

3. The electronic device of claim 1, comprising a member housed in the housing and comprising the closed surface.

4. The electronic device of claim 1, wherein the component is configured by a rubber member, and substantially seals an inside space other than the opening facing the emission opening.

5. The electronic device of claim 1, wherein the component comprises a main body and an extension, and the opening facing the emission opening is positioned between the main body and the extension.

6. The electronic device of claim 3, wherein the member is provided with a rib protruding toward the side of the speaker.

7. The electronic device of claim 1, comprising a pin, wherein the pin penetrates through the component.

8. The electronic device of claim 5, wherein the component comprises an expanded portion connecting to the main body, an inside of the main body is communicated with an inside of the expanded portion, and the main body has a substantially cylindrical shape for holding the speaker.

9. The electronic device of claim 5, wherein the main body comprises a fitting portion into which the speaker is fitted.

10. The electronic device of claim 1, wherein the component is provided with a groove part communicated with the emission opening and the opening facing the emission opening.

11. The electronic device of claim 1, wherein the housing member is an inner plate as a skeletal member.

* * * * *